United States Patent
Ogawa et al.

(10) Patent No.: US 9,970,107 B2
(45) Date of Patent: May 15, 2018

(54) METHOD OF MANUFACTURING SEMICONDUCTOR DEVICE

(71) Applicant: Hitachi Kokusai Electric Inc., Tokyo (JP)

(72) Inventors: Arito Ogawa, Toyama (JP); Atsuro Seino, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days. days.

(21) Appl. No.: 15/673,121

(22) Filed: Aug. 9, 2017

(65) Prior Publication Data
US 2018/0080122 A1 Mar. 22, 2018

(30) Foreign Application Priority Data
Sep. 21, 2016 (JP) .................................. 2016-183763

(51) Int. Cl.
| | |
|---|---|
| H01L 21/768 | (2006.01) |
| C23C 16/455 | (2006.01) |
| C23C 16/34 | (2006.01) |
| H01L 21/28 | (2006.01) |

(52) U.S. Cl.
CPC ........ *C23C 16/45531* (2013.01); *C23C 16/34* (2013.01); *C23C 16/45546* (2013.01); *H01L 21/28088* (2013.01)

(58) Field of Classification Search
CPC ......... H01L 21/02104; H01L 21/02697; H01L 21/768; H01L 21/28568
See application file for complete search history.

(56) References Cited

U.S. PATENT DOCUMENTS

| | | | | |
|---|---|---|---|---|
| 7,084,060 | B1* | 8/2006 | Furukawa | B82Y 30/00 257/751 |
| 2005/0106877 | A1* | 5/2005 | Elers | C23C 16/32 438/689 |
| 2014/0327139 | A1* | 11/2014 | Yu | H01L 23/5226 257/751 |
| 2016/0093508 | A1* | 3/2016 | Ogawa | C23C 16/455 438/476 |

FOREIGN PATENT DOCUMENTS

JP 2011-006783 A 1/2011

* cited by examiner

*Primary Examiner* — Jae Lee
(74) *Attorney, Agent, or Firm* — Edell, Shapiro & Finnan LLC

(57) ABSTRACT

A technique for forming a metal film having a high work function while suppressing an increase in EOT is provided. According to the technique, there is provided a method of manufacturing a semiconductor device, including: (a) performing a first cycle a first number of times to form a first metal layer containing a first metal element; and (b) performing a second cycle to form a second metal layer containing a second metal element directly on the first metal layer, wherein a binding energy of second metal element with oxygen is higher than that of the first metal element with oxygen, wherein a cycle including (a) and (b) is performed a second number of times to form a conductive film containing the first metal element and the second metal element on a substrate, the conductive film having: a work function higher than the first metal layer; and a binding energy with oxygen higher than that of the first metal element with oxygen.

10 Claims, 14 Drawing Sheets

FIG. 12C

| TYPE | EFFECTIVE WORK FUNTION |
|---|---|
| FIRST COMPARATIVE EXAMPLE | 4. 86eV |
| SECOND COMPARATIVE EXAMPLE | 4. 61eV |
| FIRST EMBODIMENT | 4. 83eV |

# METHOD OF MANUFACTURING SEMICONDUCTOR DEVICE

CROSS REFERENCE TO RELATED APPLICATIONS

This application claims foreign priority under 35 U.S.C. § 119(a)-(d) to Application No. JP 2016-183763 filed on Sep. 21, 2016, the entire contents of which are hereby incorporated by reference.

TECHNICAL FIELD

The present disclosure relates to a method of manufacturing a semiconductor device.

BACKGROUND

As metal oxide semiconductor field effect transistors (MOSFETs) become highly integrated and high performance, various types of metal films are used in the fabrication of MOSFETs. From the viewpoint of low power consumption, a work function close to the energy level of the conduction band or the valence band of the material of the substrate is required for the gate electrode of the MOSFET. For example, a PMOS on a silicon (Si) substrate requires a metal film having a work function of about 5.1 eV, an NMOS on a silicon (Si) substrate requires a metal film having a work function of about 4.1 eV, and a PMOS on a germanium (Ge) substrate requires a metal film having a work function of about 4.6 eV, and an NMOS on a germanium (Ge) substrate requires a metal film having a work function of about 4.1 eV. Capacitor electrode in a DRAM requires a metal film with a higher work function and lower resistance.

Since a work function of a titanium nitride film (TiN film) on a hafnium oxide ($HfO_2$) insulating film is about 4.9 eV, which is slightly lower than the energy in the vicinity of the valence band of silicon (Si), a metal film having a higher work function is required. A tungsten nitride film (WN film) is one of the metal films that have higher work functions. However, when tungsten in the tungsten nitride film is oxidized, oxygen is released from the oxidized tungsten in the subsequent heat treatment process, thereby adversely affecting the electrical characteristics.

SUMMARY

Described herein is a technique for forming a metal film having a high work function while suppressing an increase in EOT (equivalent oxide thickness).

According to one aspect of the technique described herein, there is provided a method of manufacturing a semiconductor device, including: (a) performing a first cycle a first number of times to form a first metal layer containing a first metal element, the first cycle including: (a-1) supplying a first metal-containing gas containing the first metal element to a substrate accommodated in a process chamber; (a-2) removing the first metal-containing gas from the process chamber; supplying a reactive gas to the substrate; and (a-4) removing the reactive gas from the process chamber; and (b) performing a second cycle to form a second metal layer containing a second metal element directly on the first metal layer, wherein a binding energy of second metal element with oxygen is higher than that of the first metal element with oxygen, the second cycle including: (b-1) supplying a second metal-containing gas containing the second metal element to the substrate having thereon the first metal layer and accommodated in the process chamber; (b-2) removing the second metal-containing gas from the process chamber; supplying the reactive gas to the substrate; and (b-4) removing the reactive gas from the process chamber, wherein a cycle including (a) and (b) is performed a second number of times to form a conductive film containing the first metal element and the second metal element on a substrate, the conductive film having: a work function higher than the first metal layer; and a binding energy with oxygen higher than that of the first metal element with oxygen.

BRIEF DESCRIPTION OF THE DRAWINGS

FIG. 12C is a diagram illustrating an effective work function obtained from the EOT-Vfb relationship of FIG. 12A.

DETAILED DESCRIPTION

First Embodiment

Figure 1:
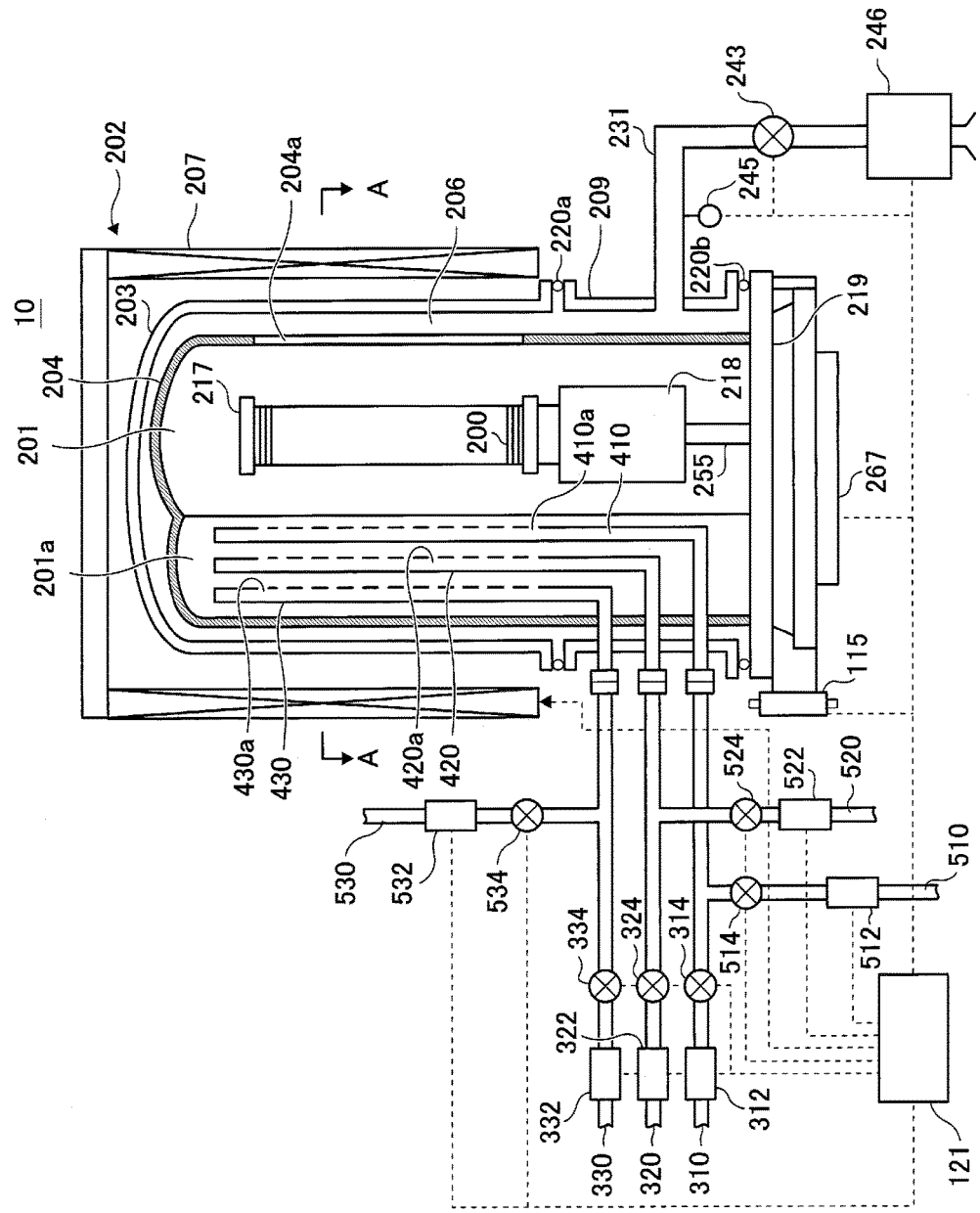
FIG. 1 schematically illustrates a vertical cross-section of a vertical type process furnace of a substrate processing apparatus used in a first embodiment.

Hereinafter, a first embodiment will be described with reference to FIG. 1 through FIG. 5. A substrate processing apparatus 10 is an example of an apparatus used in a semiconductor device manufacturing process.

(1) Configuration of Substrate Processing Apparatus

The substrate processing apparatus 10 includes a process furnace 202. The process furnace 202 includes a heater 207 serving as a heating means (a heating mechanism or a heating system). The heater 207 is cylindrical and provided in upright manner while being supported by a heater base (not shown) which is a retaining plate.

An outer tube 203 constituting a reaction vessel (a process vessel) is installed in the heater 207 so as to be concentric with the heater 207. The outer tube 203 is made of a heat-resistant material such as quartz ($SiO_2$) and silicon carbide (SiC). The outer tube 203 is cylindrical with a closed upper end and an open lower end. A manifold 209 is installed under the outer tube 203 so as to be concentric with the outer tube 203. The manifold 209 is made of a metal such as stainless steel (SUS). The manifold 209 is cylindrical with open upper and lower ends. An O-ring 220a serving as a sealing member is installed between the upper end of the manifold 209 and the outer tube 203. The outer tube 203 is provided in upright manner while supported by the manifold 209 supported by the heater base.

An inner tube 204 constituting the reaction vessel is installed in the outer tube 203. The inner tube 204 is made of a heat-resistant material such as quartz ($SiO_2$) and silicon carbide (SiC). The inner tube 204 is cylindrical with open upper and lower ends. The process vessel (the reaction vessel) is constituted by the outer tube 203, the inner tube 204 and the manifold 209. A process chamber 201 is installed in the hollow cylindrical portion (the inside of the inner tube 204) of the process vessel.

The process chamber 201 may accommodate vertically arranged wafers (substrates) 200 in a horizontal orientation in a multistage manner by a boat 217 to be described later.

Nozzles 410, 420 and 430 are installed in the process chamber 201 to penetrate sidewalls of the manifold 209 and the inner tube 204. Gas supply pipes (gas supply lines) 310, 320 and 330 are connected to the nozzles 410, 420 and 430, respectively. As described above, the substrate processing apparatus 10 includes the three nozzles 410, 420 and 430 and the three gas supply pipes 310, 320 and 330. Different gases may be supplied into the process chamber 201 via the three nozzles 410, 420 and 430 and the three gas supply pipes 310, 320 and 330. However, the process furnace 202 according to the first embodiment is not limited thereto.

MFCs (Mass Flow Controllers) 312, 322 and 332 serving as flow rate controllers (flow rate control units) are sequentially installed at the gas supply pipes 310, 320 and 330, respectively, from the upstream side to the downstream side of the gas supply pipes 310, 320 and 330. Valves 314, 324 and 334 serving as opening/closing valves are sequentially installed at the gas supply pipes 310, 320 and 330, respectively, from the upstream side to the downstream side of the gas supply pipes 310, 320 and 330. Gas supply pipes 510, 520 and 530 configured to supply an inert gas are connected to the gas supply pipes 310, 320 and 330 at the downstream sides of the valves 314, 324 and 334, respectively. MFCs 512, 522 and 532 and valves 514, 524 and 534 are sequentially installed at the gas supply pipes 510, 520 and 530, respectively from the upstream side to the downstream side of the gas supply pipes 510, 520 and 530.

The nozzles 410, 420 and 430 are connected to front ends of the gas supply pipes 310, 320 and 330, respectively. The nozzles 410, 420 and 430 may include L-shaped nozzles. Horizontal portions of the nozzles 410, 420 and 430 are installed through sidewalls of the manifold 209 and the inner tube 204. Vertical portions of the nozzles 410, 420 and 430 protrude from the inner tube 204 and are installed in a spare chamber 201a having a channel shape (a groove shape) extending in the vertical direction. That is, the vertical portions of the nozzles 410, 420 and 430 are installed in the spare chamber 201a toward the top of the inner tube 204 (in the direction in which the wafers 200 are stacked) and along inner walls of the inner tube 204.

The nozzles 410, 420 and 430 extend from the lower region of the process chamber 201 to the upper region of the process chamber 201. The nozzles 410, 420 and 430 are provided with the gas supply holes 410a, 420a and 430a facing the wafer 200, respectively such that the process gases are supplied to the wafer 200 through the gas supply holes 410a, 420a and 430a of the nozzles 410, 420 and 430. The gas supply holes 410a, 420a and 430a are provided so as to correspond to the lower region to the upper region of the inner tube 204, and have the same opening area and the same pitch. However, the gas supply holes 410a, 420a and 430a are not limited thereto. The opening areas of the gas supply holes 410a, 420a and 430a may gradually increase from the lower region toward the upper region of the inner tube 204 to maintain the uniformity of the amounts of gases supplied through the gas supply holes 410a, 420a and 430a.

The gas supply holes 410a, 420a and 430a of the nozzles 410, 420 and 430 are provided to correspond to the lower portion to the upper portion of the boat 217 to be described later. Therefore, the process gases supplied into the process chamber 201 through the gas supply holes 410a, 420a and 430a of the nozzles 410, 420 and 430 are supplied onto the wafers 200 accommodated in the boat 217 from the lower portion to the upper portion thereof, i.e. the entirety of the wafers 200 accommodated in the boat 217. The nozzles 410, 420 and 430 extend from the lower region to the upper region of the process chamber 201. However, the nozzles 410, 420 and 430 may extend only to the vicinity of the ceiling of the boat 217.

A source gas containing a first metal element (a first metal-containing gas, a first source gas), which is one of the process gases, is supplied to the process chamber 201 through the gas supply pipe 310 provided with the MFC 312 and the valve 314 and the nozzle 410. For example, titanium tetrachloride ($TiCl_4$), which contains titanium (Ti) as the first metal element and also a halogen-based source (also referred to as a halide or halogen-based titanium source), may be used as a source of the first source gas.

A reactive gas, which is one of the process gases, is supplied to the process chamber 201 through the gas supply pipe 320 provided with the MFC 322 and the valve 324 and the nozzle 420. For example, a nitrogen (N)-containing gas such as ammonia ($NH_3$) gas may be used as the reactive gas. $NH_3$ acts as a nitriding and reducing agent (a nitriding and reducing gas).

A source gas containing a second metal element (a second metal-containing gas, a second source gas), which is one of the process gases, is supplied to the process chamber 201 through the gas supply pipe 330 provided with the MFC 332 and the valve 334 and the nozzle 430. For example, tungsten hexafluoride ($WF_6$) which includes tungsten as the second metal element having a binding energy with oxygen higher than a binding energy between titanium with oxygen, may be used a source of the second source gas.

The inert gas, such as nitrogen (N2) gas, is supplied into the process chamber 201 via the gas supply pipes 510, 520 and 530 provided with the MFCs 512, 522 and 532 and the valves 514, 524 and 534, and the nozzles 410, 420 and 430. While the $N_2$ gas is exemplified as the inert gas in the first embodiment, rare gases such as argon (Ar) gas, a helium (He) gas, neon (Ne) gas and xenon (Xe) gas may be used as the inert gas instead of the $N_2$ gas.

While a process gas supply system may be constituted by the gas supply pipes 310, 320 and 330, the MFCs 312, 322 and 332, the valves 314, 324 and 334, and the nozzles 410, 420 and 430, only the nozzles 410, 420 and 430 may be considered as the process gas supply system. The process gas supply system may be simply referred to as a gas supply system. When the source gas is supplied through the gas supply pipes 310 and 330, a source gas supply system may include the gas supply pipes 310 and 330, the MFCs 312 and 332, and the valves 314 and 334. The source gas supply system may further include the nozzles 410 and 430. The source gas supply system may be simply referred to as a source supply system. When the metal-containing gas is used as the source gas, the source gas supply system may be simply referred to as a metal-containing source gas supply system. When the reactive gas is supplied through the gas supply pipe 320, a reactive gas supply system may include the gas supply pipe 320, the MFC 322 and the valve 324. The reactive gas supply system may further include the nozzle 420. When the nitrogen (N)-containing gas serving as the reactive gas is supplied through the gas supply pipe 320, the reactive gas supply system may be referred to as a nitrogen (N)-containing gas supply system. An inert gas supply system may include the gas supply pipes 510, 520 and 530, the MFCs 512, 522 and 532, and the valves 514, 524 and 534. The inert gas supply system may be simply referred to as a purge gas supply system, a dilution gas supply system, or a carrier gas supply system.

According to the first embodiment, a gas is supplied into the vertically long annular space which is defined by the inner walls of the sidewalls of the inner tube 204 and the edges (peripheries) of the plurality of wafers 200 through the nozzles 410, 420 and 430 provided in the spare chamber 201a. The gas is injected into the inner tube 204 around the wafers 200 through the plurality of gas supply holes 410a, 420a and 430a provided at the nozzles 410, 420 and 430 and facing the wafer 200, respectively. Specifically, the gas such as the source gas is injected into the inner tube 204 in a direction parallel to the surface of the wafers 200 through the gas supply holes 410a, 420a and 430a of the nozzles 410, 420 and 430, respectively.

An exhaust hole (exhaust port) 204a having a narrow slit-shape elongating vertically and facing the nozzles 410, 420 and 430, is provided in the sidewall of the inner tube 204 opposite to the spare chamber 201a. The gas supplied into the process chamber 201 through the gas supply holes 410a, 420a and 430a of the nozzles 410, 420 and 430 flows through the surfaces of the wafers 200, and then exhausted through the exhaust hole 204a into an exhaust channel 206 which is a gap between the inner tube 204 and the outer tube 203. The gas flowing in the exhaust channel 206 flows into an exhaust pipe 231 and is then discharged out of the process furnace 202.

The exhaust hole 204a is provided to face the wafers 200 (preferably, to correspond to the upper portion and the lower portion of the boat 217). A gas supplied about the wafers 200 in the process chamber 201 through the gas supply holes 410a, 420a and 430a flows in the horizontal direction, i.e., a direction parallel to the surfaces of the wafers 200, and then exhausted through the exhaust hole 204a into the exhaust channel 206. That is, the gas remaining in the process chamber 201 is exhausted in parallel to the surfaces of the wafers 200 through the exhaust hole 204a. Furthermore, the exhaust hole 204a is not limited to a slit-shaped through-hole and may include a plurality of holes.

The exhaust pipe 231 for exhausting the inner atmosphere of the process chamber 201 is installed at the manifold 209. A vacuum pump 246 serving as a vacuum exhauster is connected to the exhaust pipe 231 through a pressure sensor 245 and an APC (Automatic Pressure Controller) valve 243. The pressure sensor 245 serves as a pressure detector (pressure detection unit) to detect the inner pressure of the process chamber 201, and the APC valve 243 serves as a pressure controller (pressure control unit). With the vacuum pump 246 in operation, the APC valve 243 may be opened/closed to vacuum-exhaust the process chamber 201 or stop the vacuum exhaust. With the vacuum pump 246 in operation, the opening degree of the APC valve 243 may be adjusted in order to control the inner pressure of the process chamber 201. An exhaust system (an exhaust line) may include the exhaust pipe 231, the APC valve 243 and the pressure sensor 245. The exhaust system may further include the vacuum pump 246.

A seal cap 219, serving as a furnace opening cover capable of sealing the lower end opening of the manifold 209 in airtight manner, is provided under the manifold 209. The seal cap 219 is in contact with the lower end of the manifold 209 from thereunder. The seal cap 219 is made of metal such as SUS, and is disk-shaped. The O-ring 220b, serving as a sealing member and being in contact with the lower end of the manifold 209, is provided on the upper surface of the seal cap 219. A rotating mechanism 267 configured to rotate the boat 217 to be described later is provided in the seal cap 219 opposite to the process chamber 201. A rotating shaft 255 of the rotating mechanism 267 is connected to the boat 217 through the seal cap 219. As the rotating mechanism 267 rotates the boat 217, the wafers 200 are rotated. The seal cap 219 may be moved upward/downward in the vertical direction by a boat elevator 115 installed outside the outer tube 203 and serving as an elevating mechanism. When the seal cap 219 is moved upward/downward by the boat elevator 115, the boat 217 may be loaded into the process chamber 201 or unloaded out of the process chamber 201. The boat elevator 115 serves as a transfer device (transfer mechanism) that loads the boat 217, that is, the wafers 200 into the process chamber 201 or unloads the boat 217, that is, the wafers 200 out of the process chamber 201.

The boat 217 serving as a substrate retainer supports a plurality of wafers 200, (for example, 25 to 200 wafers), which are concentrically arranged in the vertical direction and in horizontally orientation. The boat 217 is made of a heat-resistant material such as quartz and SiC. An insulating plate 218 is made of a heat resisting material such as quartz and SiC. The insulating plate and installed in multi-stages under the boat 217. The insulating plate 218 suppresses the transmission of heat from a heater 207 to the seal cap 219. Instead of the insulating plate 218, a heat insulating cylinder (not shown) may be installed as a cylindrical member made of a heat resisting material such as quartz and SiC.

Figure 2:
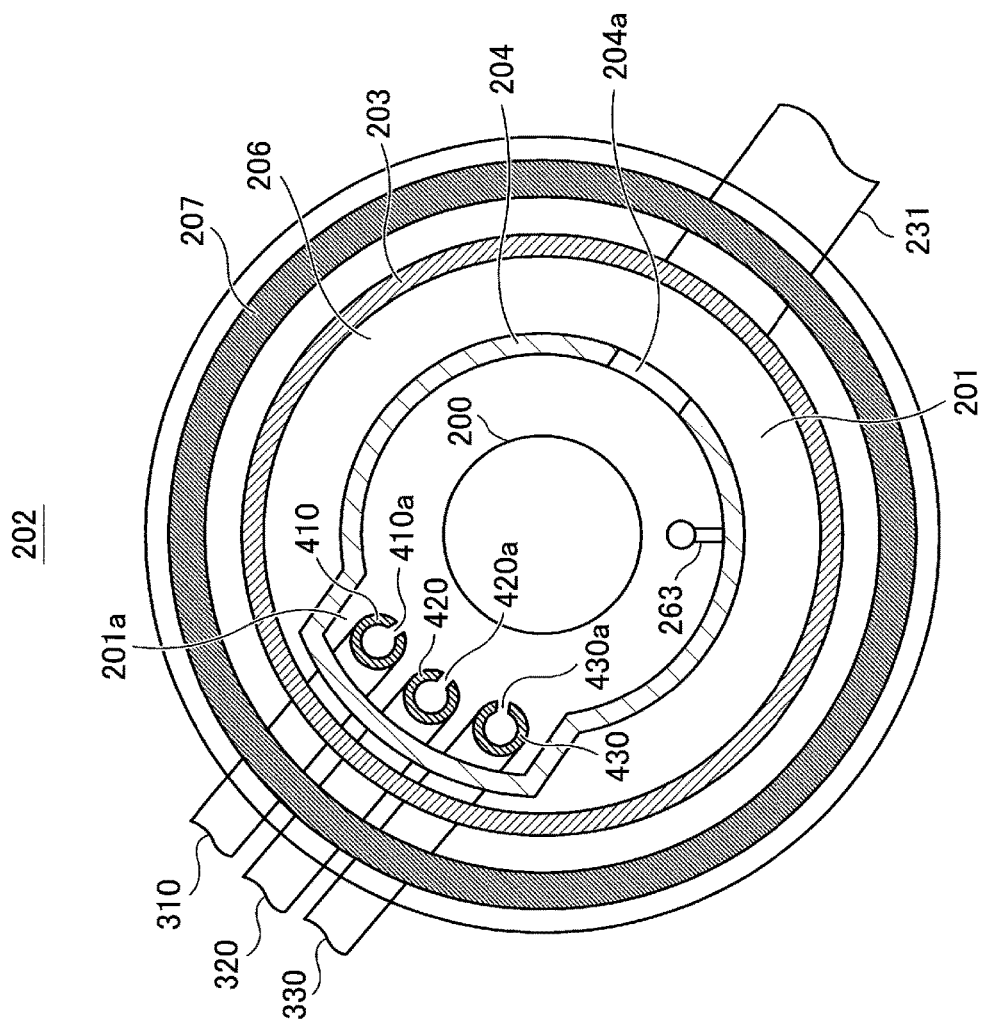
FIG. 2 schematically illustrates a cross-section taken along the line A-A of FIG. 1.

As shown in FIG. 2, a temperature sensor 52 serving as a temperature detector is installed in the inner tube 204. The energization state of the heater 207 is adjusted based on the temperature detected by the temperature sensor 52 such that the inner temperature of the process chamber 201 has a desired temperature distribution. The temperature sensor 52 is L-shaped like the nozzles 410, 420 and 430, and provided along the inner wall of the inner tube 204.

Figure 3:
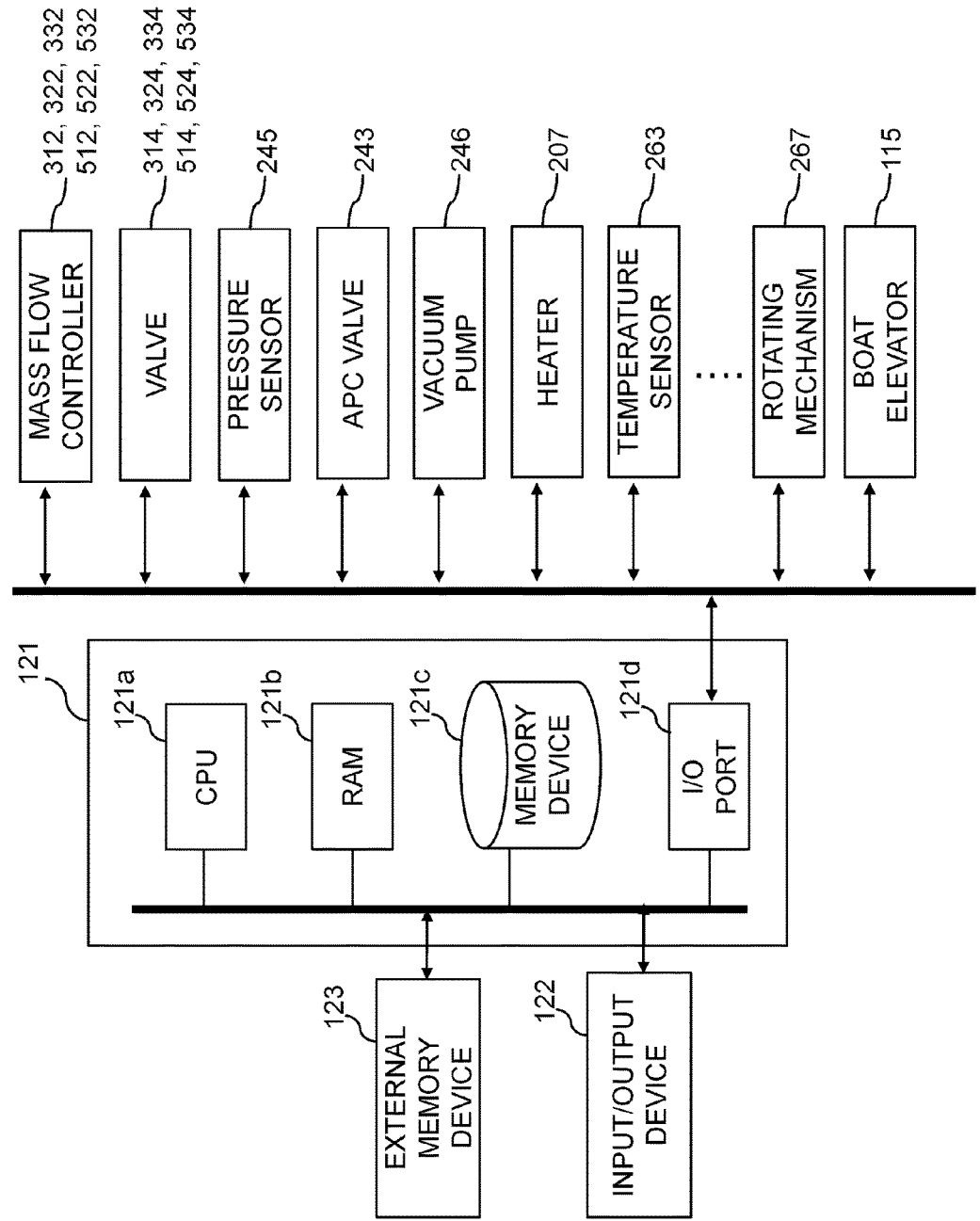
FIG. 3 schematically illustrates a configuration of a controller and components controlled by the controller of the substrate processing apparatus according to the first embodiment.

As shown in FIG. 3, the controller 121 serving as a control unit is embodied by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus 121e. For example, an I/O device 122 such as a touch panel is connected to the controller 121.

The memory device 121c is embodied by components such as a flash memory and HDD (Hard Disk Drive). A control program for controlling the operation of the substrate processing apparatus or a process recipe containing information on the sequence and conditions of a substrate processing (a method of manufacturing a semiconductor device) described later is readably stored in the memory device 121c. The process recipe is obtained by combining steps of the substrate processing described later such that the controller 121 can execute the steps to acquire a predetermine result, and functions as a program. Hereafter, the process recipe and the control program are collectively referred to as a program. The process recipe is simply referred to as a recipe. In this specification, "program" may indicate only the recipe, indicate only the control program, or indicate both of them. The RAM 121b is a work area where a program or data read by the CPU 121a is temporarily stored.

The I/O port 121d is connected to the above-described components such as the MFCs 312, 322 and 332, 512, 522 and 532, the valves 314, 324 and 334, 514, 524 and 534, the pressure sensor 245, the APC valve 243, the vacuum pump 246, the heater 207, the temperature sensor 263, the rotating mechanism 267 and the boat elevator 115.

The CPU 121a is configured to read the control program from the memory device 121c and execute the read control program. Furthermore, the CPU 121a is configured to read a recipe from the memory device 121c according to an operation command inputted from the I/O device 122. According to the contents of the read recipe, the CPU 121a may be configured to control various operations such as flow rate adjusting operations for various gases by the MFCs 312, 322 and 332, 512, 522 and 532, opening/closing operations of the valves 314, 324 and 334, 514, 524 and 534, an opening/closing operation of the APC valve 243, a pressure adjusting operation by the APC valve 243 based on the pressure sensor 245, a temperature adjusting operation of the heater 207 based on the temperature sensor 263, a start and stop of the vacuum pump 246, a rotation operation and rotation speed adjusting operation of the boat 217 by the rotating mechanism 267, an elevating operation of the boat 217 by the boat elevator 115, and a transport operation of the wafer to the boat 217.

The controller 121 may be embodied by installing the above-described program stored in an external memory device 123 into a computer, the external memory device 123 including a magnetic disk such as a hard disk and a flexible disk, an optical disk such as CD and DVD, a magneto-optical disk such as MO, and a semiconductor memory such as a USB memory. The memory device 121c or the external memory device 123 may be embodied by a transitory computer readable recording medium. Hereafter, the memory device 121c and the external memory device 123 are collectively referred to as recording media. In this specification, "recording media" may indicate only the memory device 121c, indicate only the external memory device 123, and indicate both of the memory device 121c and the external memory device 123. Instead of the external memory device 123, a communication unit such as the Internet and a dedicated line may be used as the unit for providing the program to the computer.

(2) Substrate Processing (Film-Forming Steps)

An exemplary sequence of forming a metal film constituting a gate electrode on the wafer 200, which is one of substrate processings for manufacturing a semiconductor device, will be described with reference to FIGS. 4 and 5. The sequence of forming the metal film is performed using the process furnace 202 of the substrate processing apparatus 10. Herein, the components of the substrate processing apparatus 10 are controlled by the controller 121.

In the substrate processing (semiconductor manufacturing process) according to the first embodiment, a first cycle is performed a first number of times to form TiN layer containing titanium, the first cycle including: (a-1) supplying $TiCl_4$ gas to a wafer 200 accommodated in the process chamber 201; (a-2) removing the $TiCl_4$ gas from the process chamber 201; supplying $NH_3$ gas to the wafer 200; and (a-4) removing the $NH_3$ gas from the process chamber 201. Thereafter, a second cycle is performed to form WN layer directly on the TiN layer, wherein a binding energy of tungsten with oxygen is higher than that of the titanium with oxygen, the second cycle including: (b-1) supplying $WF_6$ gas to the wafer 200 having the TiN layer thereon and accommodated in the process chamber 201; (b-2) removing the $WF_6$ gas from the process chamber 201; supplying $NH_3$ gas to the wafer 200; and (b-4) removing the $NH_3$ gas from the process chamber 201. The steps (a) and (b) are then performed a second number of times to form TiWN film (metal nitride film) on the wafer 200, the conductive film having: a work function higher than that of the TiN layer; and a binding energy with oxygen higher than that of the titanium with oxygen.

In this specification, "wafer" may refer to "a wafer itself" or refer to "a wafer and a stacked structure (aggregated structure) of predetermined layers or films formed on the surface of the wafer". That is, the wafer and the predetermined layers or films formed on the surface of the wafer may be collectively referred to as the wafer. In this specification, "surface of wafer" refers to "a surface (exposed surface) of a wafer" or "the surface of a predetermined layer or film formed on the wafer, i.e. the top surface of the wafer as a stacked structure". In this specification, "substrate" and "wafer" may be used as substantially the same meaning.

Wafer Loading Step

After the boat 217 is charged with wafers 200 (wafer charging), the boat 217 is lifted by the boat elevator 115 and loaded into the process chamber 201 (boat loading) as shown in FIG. 1. With the boat 217 loaded, the seal cap 219 seals the lower end opening of the reaction tube 203 via the O-ring 220.

Pressure and Temperature Adjusting Step

The vacuum pump 246 vacuum-exhausts the process chamber 201 until the inner pressure of the process chamber 201 reaches a desired pressure (vacuum degree). At this time, the inner pressure of the process chamber 201 is measured by the pressure sensor 245, and the APC valve 243 is feedback-controlled based on the measured pressure (pressure adjusting). The vacuum pump 246 is continuously operated until at least the processing of the wafers 200 is complete. The heater 207 heats the process chamber 201 such that the temperature of the wafers 200 in the process chamber 201 reaches a predetermined temperature. The energization state of the heater 207 is feedback-controlled based on the temperature detected by the temperature sensor 263 such that the inner temperature of the process chamber 201 has a desired temperature distribution (temperature adjusting). The heater 207 continuously heats the process chamber 201 until at least the processing of the wafers 200 is completed.

TiN Layer Forming Step

Next, a step of forming a metal nitride layer such as a TiN layer serving as a first metal layer is performed.

$TiCl_4$ Gas Supply Step S10

In the $TiCl_4$ gas supply step S10, the valve 314 is opened to supply $TiCl_4$ gas, which is a source gas, into the gas supply pipe 310. A flow rate of $TiCl_4$ gas is adjusted by the MFC 312. The $TiCl_4$ gas with the flow rate thereof adjusted is supplied into the process chamber 201 through the gas supply holes 410a of the nozzle 410 to supply the $TiCl_4$ gas onto the wafers 200, and then exhausted through the exhaust pipe 231 Simultaneously, the valve 514 is opened to supply an inert gas such as $N_2$ gas into the gas supply pipe 510. A flow rate of $N_2$ gas is adjusted by the MFC 512. The $N_2$ gas with the flow rate thereof adjusted is supplied with the $TiCl_4$ gas into the process chamber 201, and exhausted through the exhaust pipe 231. In order to prevent the $TiCl_4$ gas from entering the nozzles 420 and 430, the valves 524 and 534 are opened to supply $N_2$ gas into the gas supply pipes 520 and 530. The $N_2$ gas is supplied into the process chamber 201 through the gas supply pipes 320 and 330 and the nozzles 420 and 430, and exhausted through the exhaust pipe 231.

The APC valve 243 is appropriately controlled to adjust the inner pressure of the process chamber 201. For example, the inner pressure of the process chamber 201 may range from 0.1 Pa to 6650 Pa. The flow rate of the $TiCl_4$ gas supplied into the process chamber 201 is adjusted by the MFC 312. For example, the flow rate of the $TiCl_4$ gas may range from 0.1 slm to 2 slm. The flow rates of the $N_2$ gas supplied into the process chamber 201 are adjusted by the MFCs 512, 522 and 532. For example, the flow rates of the $N_2$ gas supplied into the process chamber 201 may range from 0.1 slm to 30 slm. A time duration of the supply of the $TiCl_4$ gas onto the wafers 200, for example, may range from 0.01 second to 20 seconds. At this time, the temperature of the heater 207 ranges, for example, from 250° C. to 550° C.

In the $TiCl_4$ gas supply step S10, only $TiCl_4$ gas and $N_2$ gas are supplied into the process chamber 201. A titanium-containing layer having a thickness of, for example, less than one atomic layer to several atomic layers is formed on the wafer 200 (or on a underlying film on the wafer 200) by supplying $TiCl_4$ gas. The titanium-containing layer may include a Ti layer containing Cl, an adsorption layer of $TiCl_4$, or both. Hereinafter, the term "a layer having a thickness less than one atomic layer" refers to a discontinuous atomic layer and "a layer having a thickness of one atomic layer" refers to a continuous atomic layer.

Residual Gas Removing Step S11

After the titanium-containing layer is formed on the wafers 200, the valve 314 is closed to stop the supply of the $TiCl_4$ gas. With the APC valve 243 of the exhaust pipe 231 open, the vacuum pump 246 vacuum-exhausts the interior of the process chamber 201 to remove residual $TiCl_4$ gas which did not react or contributed to the formation of the titanium-containing layer from the process chamber 201. By maintaining the valves 514, 524 and 534 open, $N_2$ gas is continuously supplied into the process chamber 201. $N_2$ gas acts as a purge gas, which improves an effect of removing the residual $TiCl_4$ gas which did not react or contributed to the formation of the titanium-containing layer from the process chamber 201.

$NH_3$ Gas Supply Step S12

After the residual gas is removed from the process chamber 201, the valve 324 is opened to supply $NH_3$, gas which is a nitrogen (N)-containing gas (reactive gas), into the gas supply pipe 320. A flow rate of $NH_3$ gas is adjusted by the MFC 322. The $NH_3$ gas with the flow rate thereof adjusted is supplied into the process chamber 201 through the gas supply holes 420a of the nozzle 420 to be supplied onto the wafers 200, and then exhausted through the exhaust pipe 231. Simultaneously, the valve 524 is opened to supply $N_2$ gas into the gas supply pipe 520. A flow rate of $N_2$ gas is adjusted by the MFC 522. The $N_2$ gas with the flow rate thereof adjusted is supplied with the $NH_3$ gas into the process chamber 201, and exhausted through the exhaust pipe 231. In order to prevent the $NH_3$ gas from entering the nozzles 410 and 430, the valves 514 and 534 are opened to supply $N_2$ gas into the gas supply pipes 510, and 530. The $N_2$ gas is supplied into the process chamber 201 through the gas supply pipes 310 and 330 and the nozzles 410 and 430, and exhausted through the exhaust pipe 231.

The APC valve 243 is appropriately controlled to adjust the inner pressure of the process chamber 201 when the $NH_3$ gas is supplied into the process chamber 201. For example, the inner pressure of the process chamber 201 may range from 0.1 Pa to 6650 Pa. The flow rate of the $NH_3$ gas supplied into the process chamber 201 is adjusted by the MFC 322. For example, the flow rate of the $NH_3$ gas may range from 0.1 slm to 20 slm. The flow rates of the $N_2$ gas supplied into the process chamber 201 are adjusted by the MFCs 512, 522 and 532 such that the flow rates of the $N_2$ gas may range from 0.1 slm to 30 slm. A time duration of the supply of the $NH_3$ gas onto the wafers 200, for example, may range from 0.01 to 30 seconds. The temperature of the heater 207 is adjusted to be the same as that of the $TiCl_4$ gas supply step S10.

In the $NH_3$ gas supply step S12, only the $NH_3$ gas and the $N_2$ gas are supplied into the process chamber 201. A substitution reaction occurs between the $NH_3$ gas and at least a portion of the titanium-containing layer formed on the wafer 200 in the $NH_3$ gas supply step S12. During the substitution reaction, titanium contained in the titanium-containing layer and nitrogen contained in the $NH_3$ gas are bonded. As a result, a TiN layer containing Ti and N is formed on the wafer 200.

Residual Gas Removing Step S13

After the TiN layer is formed on the wafers 200, the valve 324 is closed to stop the supply of the $NH_3$ gas. The residual $N_3$ gas which did not react or contributed to the formation of the TiN layer and reaction byproducts are removed from the process chamber 201 according to the same process as the residual gas removing step S11.

Determination Step S14

A TiN layer having a predetermined thickness is formed on the wafer 200 by performing a first cycle including the $TiCl_4$ gas supply step S10 through the residual gas removing step S13 performed in order a predetermined number of times (n times, n is an integer equal to or greater than 1). That is, the first cycle is repeated ("No" in the determination step S14) until the number of the first cycle performed reaches n times ("Yes" in the determination step S14). The thickness of the TiN layer ranges, for example, from 0.1 nm to 2 nm. Preferably, the first cycle is performed a plurality of times. Preferably, the first cycle is performed 10 to 80 times, more preferably 10 to 15 times. The reason for repeating the first cycle multiple times is as follows. Hydrogen fluoride (HF) is produced by the reaction between fluorine (F) contained in WF6 and hydrogen (H) contained in $NH_3$ and adsorbed on the wafer 200 used in the WN layer forming step which will be described later. HF can etch the TiN layer. Considering the etching of the TiN layer, the first cycle should be performed at least 10 times to obtain a TiN layer having a sufficient thickness after being etched such that a titanium to tungsten ratio is 1. That is, when the first cycle is performed less than 10 times, the TiN layer after being etched does not have a sufficient thickness such that the titanium to tungsten ratio is less than 1. When the first cycle is performed more than 80 times, the TiN layer is too thick even after being etched such that the titanium to tungsten ratio is more than 1.

WN Layer Forming Step

Next, a step of forming a metal nitride layer such as a WN layer serving as a second metal layer is performed.

$WF_6$ Gas supply step S20

In the $WF_6$ gas supply step S20, the valve 334 is opened to supply $WF_6$ gas serving as a source gas into the gas supply pipe 330. A flow rate of $WF_6$ gas is adjusted by the MFC 332. The $WF_6$ gas with the flow rate thereof adjusted is supplied into the process chamber 201 through the gas supply holes 430a of the nozzle 430 to be supplied onto the wafers 200, and then exhausted through the exhaust pipe 231. Simultaneously, the valve 534 is opened to supply an inert gas such as $N_2$ gas into the gas supply pipe 530. A flow rate of $N_2$ gas is adjusted by the MFC 532. The $N_2$ gas with the flow rate thereof adjusted is supplied with the $WF_6$ gas into the process chamber 201, and exhausted through the exhaust pipe 231. In order to prevent the $WF_6$ gas from entering the nozzles 410 and 420, the valves 514 and 524 are opened to supply $N_2$ gas into the gas supply pipes 510 and 520. The $N_2$ gas is supplied into the process chamber 201 through the gas supply pipes 310 and 320 and the nozzles 410 and 420, and exhausted through the exhaust pipe 231.

The APC valve 243 is appropriately controlled to adjust the inner pressure of the process chamber 201. For example, the inner pressure of the process chamber 201 may range from 0.1 Pa to 6650 Pa. The flow rate of the $WF_6$ gas supplied into the process chamber 201 is adjusted by the MFC 3132. For example, the flow rate of the $WF_6$ gas may range from 0.01 slm to 10 slm. The flow rates of the $N_2$ gas supplied into the process chamber 201 are adjusted by the MFCs 512, 522 and 532. For example, the flow rates of the $N_2$ gas may range from 0.1 slm to 30 slm. A time duration of the supply of the $WF_6$ gas onto the wafers 200 ranges, for example, from 0.001 seconds to 30 seconds. The temperature of the heater 207 is adjusted such that the temperature of wafers 200 ranges, for example, from 250° C. to 550° C. Only the $WF_6$ gas and the $N_2$ gas are supplied into the process chamber 201. By supplying the $WF_6$ gas, a tungsten (W)-containing layer having a thickness of less than one atomic layer to several atomic layers, for example, is formed on the wafer 200 (on the underlying film on the wafer 200).

Residual Gas Removing Step S21

After the tungsten-containing layer is formed on the wafers 200, the valve 334 is closed to stop the supply of the $WF_6$ gas. The residual $WF_6$ gas which did not react or contributed to the formation of the tungsten-containing layer is removed from the process chamber 201 according to the same process as the residual gas removing step S11.

$NH_3$ Gas Supply Step S22

After the residual gas is removed from the process chamber 201, the $NH_3$ gas and the $N_2$ gases are supplied into the process chamber 201 according to the same process as the $NH_3$ gas supply step S12.

In the $NH_3$ gas supply step S22, only the $NH_3$ gas and the $N_2$ gas are supplied into the process chamber 201. A substitution reaction occurs between the $NH_3$ gas and at least a portion of the tungsten-containing layer formed on the wafer 200 in the $NH_3$ gas supply step S22. During the substitution reaction, the tungsten contained in the tungsten-containing layer and nitrogen contained in the $NH_3$ gas are bonded. As a result, a WN layer containing W and N is formed on the wafer 200.

Residual Gas Removing Step S23

After the WN layer is formed on the wafers 200, the valve 324 is closed to stop the supply of the $NH_3$ gas. The residual $NH_3$ gas which did not react or contributed to the formation of the WN layer and reaction byproducts are removed from the process chamber 201 according to the same process as the residual gas removing step S11.

Determination Step S24

A TiWN layer having a predetermined thickness is formed on the wafer 200 by performing a second cycle including the $WF_6$ gas supply step S20 through the residual gas removing step S23 performed in order a predetermined number of times (p times, p is an integer equal to or greater than 1) after performing the second cycle a predetermined number of times. That is, the second cycle is repeated ("No" in the determination step S24) until the number of the second cycle performed reaches p times ("Yes" in the determination step S24). The thickness of the TiWN layer ranges, for example, from 0.1 nm to 10 nm. Preferably, the second cycle including the $WF_6$ gas supply step S20 through the residual gas removing step S23 is performed a plurality of times.

Purging and Returning to Atmospheric Pressure Step $N_2$ gas is supplied into the process chamber 201 through each of the gas supply pipes 510, 520 and 530 and then exhausted through the exhaust pipe 231. The $N_2$ gas acts as a purge gas. The process chamber 201 is thereby purged such that the residual gas or the reaction by-products remaining in the process chamber 201 are removed from the process chamber 201 (purging). Thereafter, the inner atmosphere of the process chamber 201 is replaced with an inert gas, and the inner pressure of the process chamber 201 is returned to atmospheric pressure (returning to atmospheric pressure).

Boat Unloading Step

The seal cap 219 is lowered by the boat elevator 115 and the lower end of the reaction tube 203 is opened. The boat 217 with the processed wafer 200 charged therein is unloaded from the reaction tube 203 through the lower end of the reaction tube 203 (boat unloading). The processed wafer 200 is discharged from the boat 217 (wafer discharging).

According to the first embodiment, the WN layer forming step is performed such that titanium atoms or TiN molecules are disposed within three bonds of WN molecules. When the titanium atom or the TiN molecule is disposed at a position farther than three bonds of the WN molecule, the infiltrated oxygen atom is likely to be released. Preferably, at least the WN molecule is arranged to bond with a titanium atom or TiN molecule. It is preferable that the second cycle including the WF6 gas supply step S20 through the residual gas removing step S23 of the WN layer forming step is performed one or more times, and it is more preferable that the second cycle is performed once. When the second cycle is performed two or more times such that the WN concentration is increased, the oxygen atom is likely to be released from the film with higher work function. Therefore, it is preferable that second cycle is performed once.

Figure 6A:
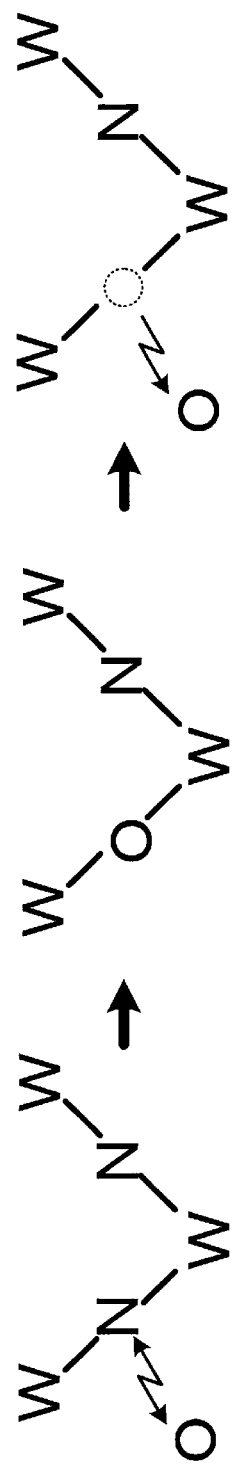
FIGS. 6A and 6B are diagrams illustrating structures of a W—N—W bond and a W—N—Ti bond.
Figure 6B:
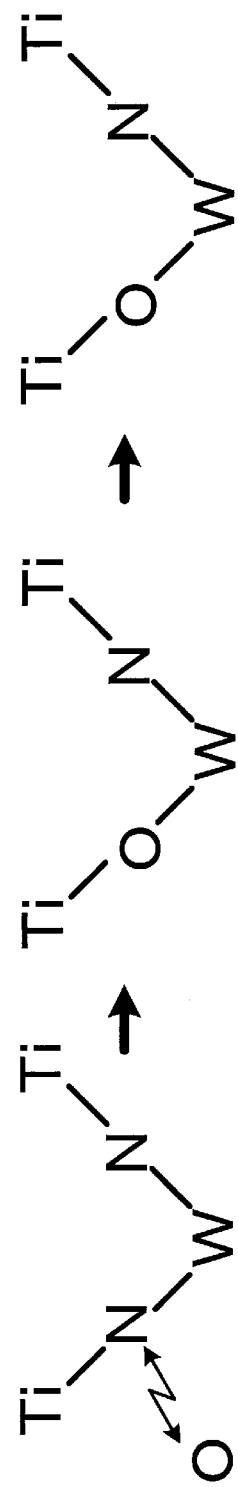

As shown in FIG. 6A, the nitrogen atom of the W—N—W bond in the WN molecule is replaced by an oxygen atom such that the oxygen atom penetrates into the WN molecule. The oxygen atom that has penetrated the WN molecule is likely to releases. As shown in FIG. 6B, the nitrogen atom of the W—N—Ti bond of the WN molecule is replaced by an oxygen atom such that the oxygen atom penetrates into the WN molecule. Since the oxygen atom that has that has penetrated the WN molecule bonds to the titanium atom having strong binding energy with the oxygen atom, the oxygen atom is not released and remains in the WN molecule. Therefore, the W—O—Ti bond is maintained. That is, by forming a state in which the titanium atom or TiN molecule is always bonded about the W—N bond, a conductive TiWN film having both of the characteristics of WN having a high work function and the characteristics of TiN unlikely to release oxygen atom.

When the Ti concentration of the film increases, the work function of the film is lowered. As the W concentration increases, the work function is elevated. However, as the WN concentration increases, oxygen is likely to be released. Therefore, the titanium to tungsten ratio should be adjusted (controlled) according to the desired work function. The titanium to tungsten ratio may be adjusted (controlled) by changing the number of cycles for forming each film.

(3) Effects of the First Embodiment

According to the first embodiment, the following one or more advantageous effects are provided.

(a) The TiWN film having both of the characteristics of WN having a high work function and the characteristics of TiN unlikely to release oxygen atom may be formed.

(b) By using the TiWN film as the gate electrode of the MOSFET, a MOSFET having a low EOT, a low leakage current and a low threshold voltage may be manufactured.

(c) The damage on the gate insulating film caused by fluorine in $WF_6$ may be reduced by the TiN film.

FIRST MODIFIED EXAMPLE

Figure 7:
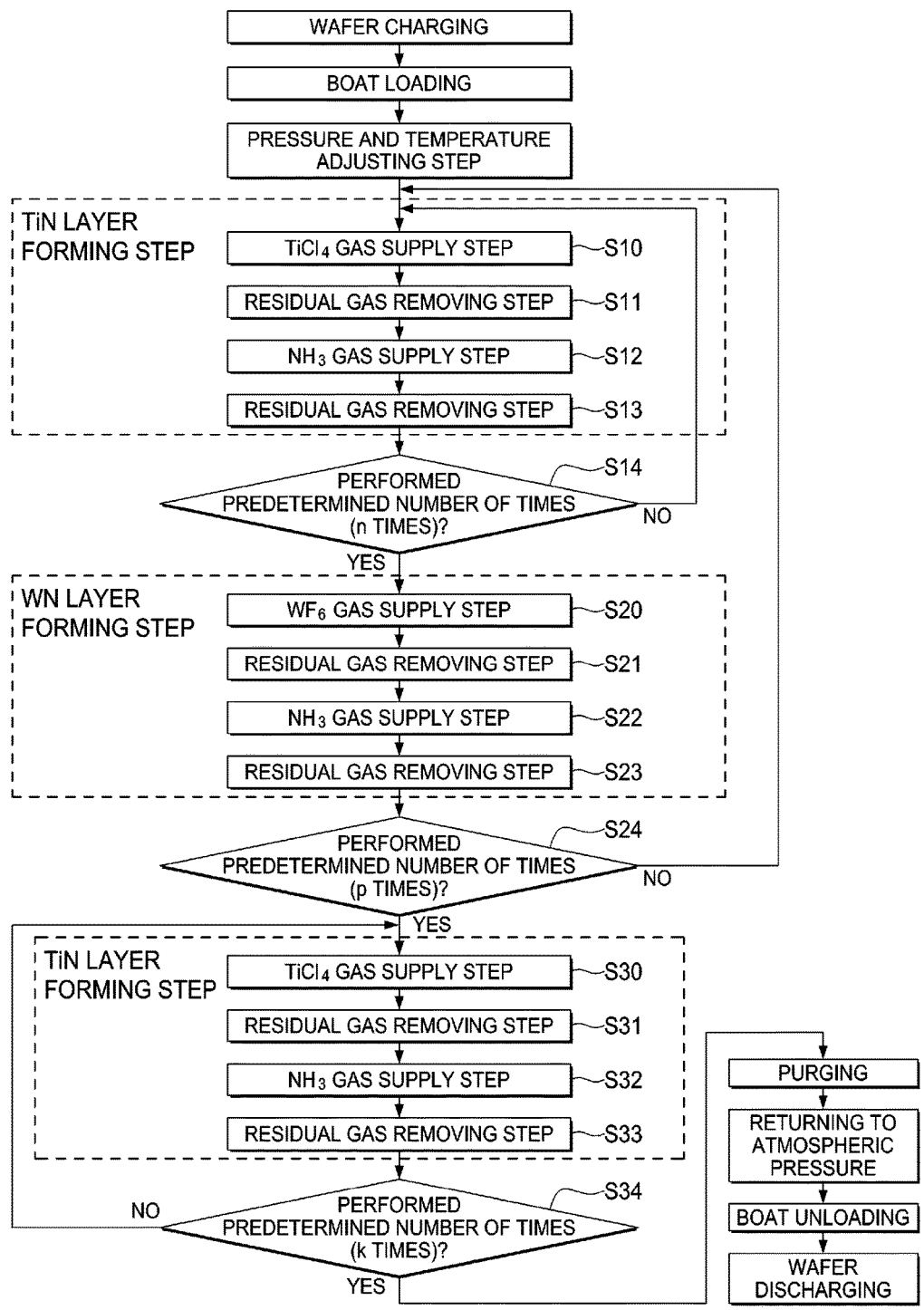
FIG. 7 illustrates a first modified example of the substrate processing according to the first embodiment.

According to the first modified example of the first embodiment, as shown in FIG. 7, first, the first cycle including the $TiCl_4$ gas supply step S10 through the residual gas removing step S13 performed in order, which is the TiN layer forming step according to the first embodiment, is performed one or more times (n times), and the second cycle including the $WF_6$ gas supply step S20 through the residual gas removing step S23 performed in order, which is the WN layer forming step according to the first embodiment, is then performed once. Thereafter, a cycle including the TiN layer forming step performed n times and the WN layer forming step performed once, which are performed in order, may performed one or more times (p times). That is, the third cycle is repeated ("No" in the determination step S34) until the number of the third cycle performed reaches k times ("Yes" in the determination step S34). Unlike the first embodiment, according to the first modified example, a third cycle including a $TiCl_4$ gas forming step S30, a TiN layer forming step S30, a residual gas removing step S31, an $NH_3$ gas supply step S32 and a residual gas removing step S33, which are performed in order, is performed one or more times (k times). The gas supply schemes and the residual gas removing schemes of the $TiCl_4$ gas supply step S30 through the residual gas removing step S33 are substantially the same as those of the $TiCl_4$ gas supply step S10 through the residual gas removing step S13. The first modified example provides the same advantageous effects as those provided by the film-forming sequence shown in FIG. 4. In addition, according to the first modified example, the oxidation of the WN film may be prevented by forming a TiN film on the WN film according to the film-forming sequence shown in FIG. 7.

SECOND MODIFIED EXAMPLE

Figure 8:
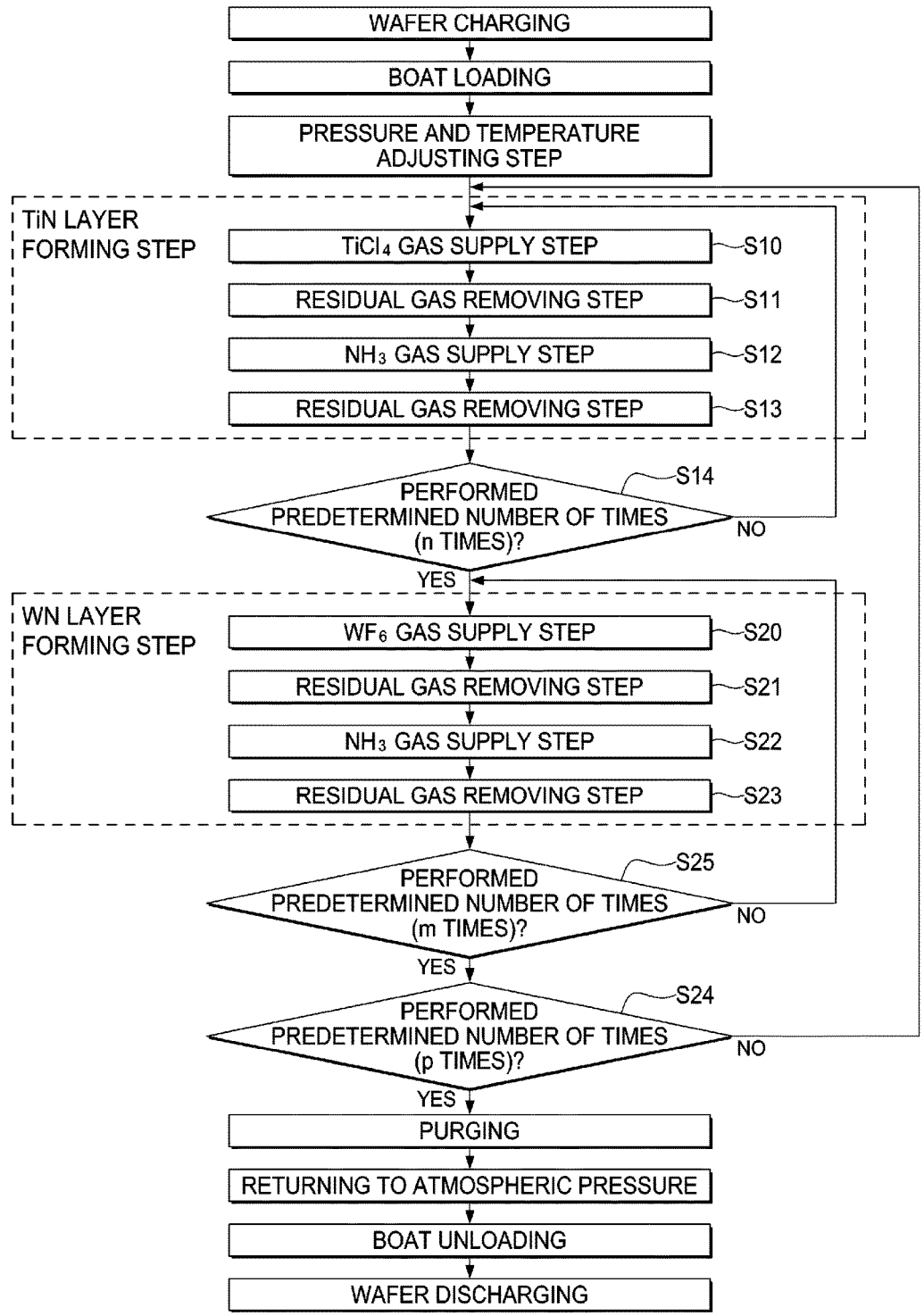
FIG. 8 illustrates a second modified example of the substrate processing according to the first embodiment.

According to the second modified example of the first embodiment, as shown in FIG. 8, first, the first cycle including the $TiCl_4$ gas supply step S10 through the residual gas removing step S13 performed in order, which is the TiN layer forming step according to the first embodiment, is performed one or more times (n times), and the second cycle including the $WF_6$ gas supply step S20 through the residual gas removing step S23 performed in order, which is the WN layer forming step according to the first embodiment, is performed one or more times (m times) (S25) contrary to the first embodiment. Thereafter, a cycle including the first cycle and the second cycle performed in order is performed one or more times (p times). That is, the cycle including the first cycle and the second cycle is repeated ("No" in the determination step S24) until the number of the cycle performed reaches p times ("Yes" in the determination step S24). The second modified example provides the same advantageous effects as those provided by the film-forming sequence shown in FIG. 4. In addition, according to the second modified example, a conductive TiWN film having higher W concentration and high work function may be formed by performing the film-forming sequence shown in FIG. 8.

THIRD MODIFIED EXAMPLE

Figure 9:
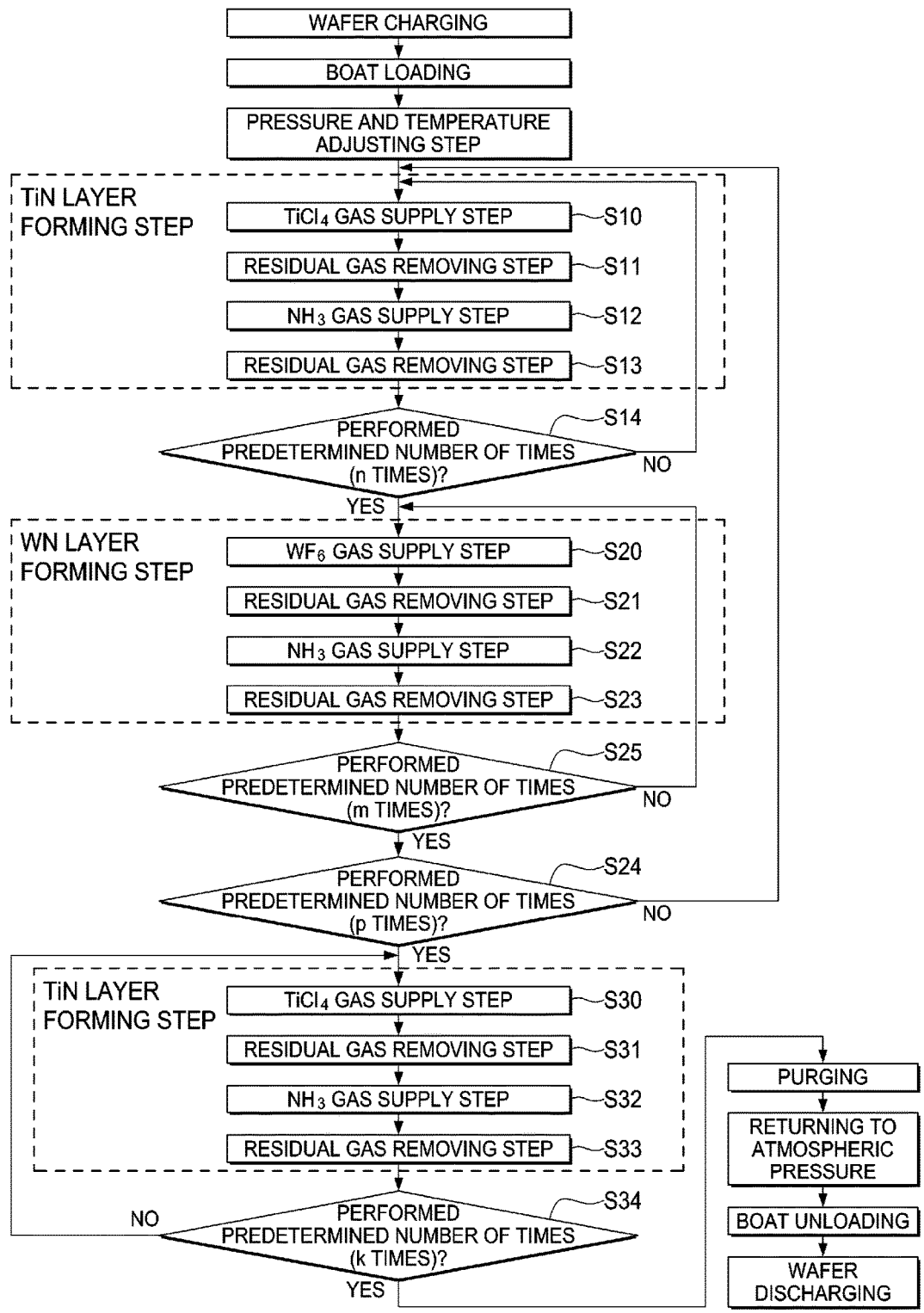
FIG. 9 illustrates a third modified example of the substrate processing according to the first embodiment.

According to the third modified example of the first embodiment, as shown in FIG. 9, first, the first cycle including the $TiCl_4$ gas supply step S10 through the residual gas removing step S13 performed in order, which is the TiN layer forming step according to the first embodiment, is performed one or more times (n times), and the second cycle including the $WF_6$ gas supply step S20 through the residual gas removing step S23 performed in order, which is the WN layer forming step according to the first embodiment, is performed one or more times (m times) (S25) similar to the second modified example. Thereafter, a cycle including the first cycle and the second cycle performed in order is performed one or more times (p times) (S24). Unlike the second modified example, according to the third modified example, the third cycle including the $TiCl_4$ gas forming step S30, the TiN layer forming step S30, the residual gas removing step S31, the $NH_3$ gas supply step S32 and the residual gas removing step S33, which are performed in order, is performed one or more times (k times). That is, the third cycle is repeated ("No" in the determination step S34) until the number of the third cycle performed reaches k times ("Yes" in the determination step S34). The gas supply schemes and the residual gas removing schemes of the $TiCl_4$ gas supply step S30 through the residual gas removing step S33 are substantially the same as those of the $TiCl_4$ gas supply step S10 through the residual gas removing step S13. The third modified example provides the same advantageous effects as those provided by the film-forming sequence shown in FIG. 4. In addition, according to the third modified example, a conductive TiWN film having higher W concentration may be formed according to the film-forming sequence shown in FIG. 9. Moreover, since the TiN film is present on the top surface of the TiWN film, the oxidation of the TiWN film due to the exposure to atmosphere may be prevented.

Second Embodiment

Figure 4:
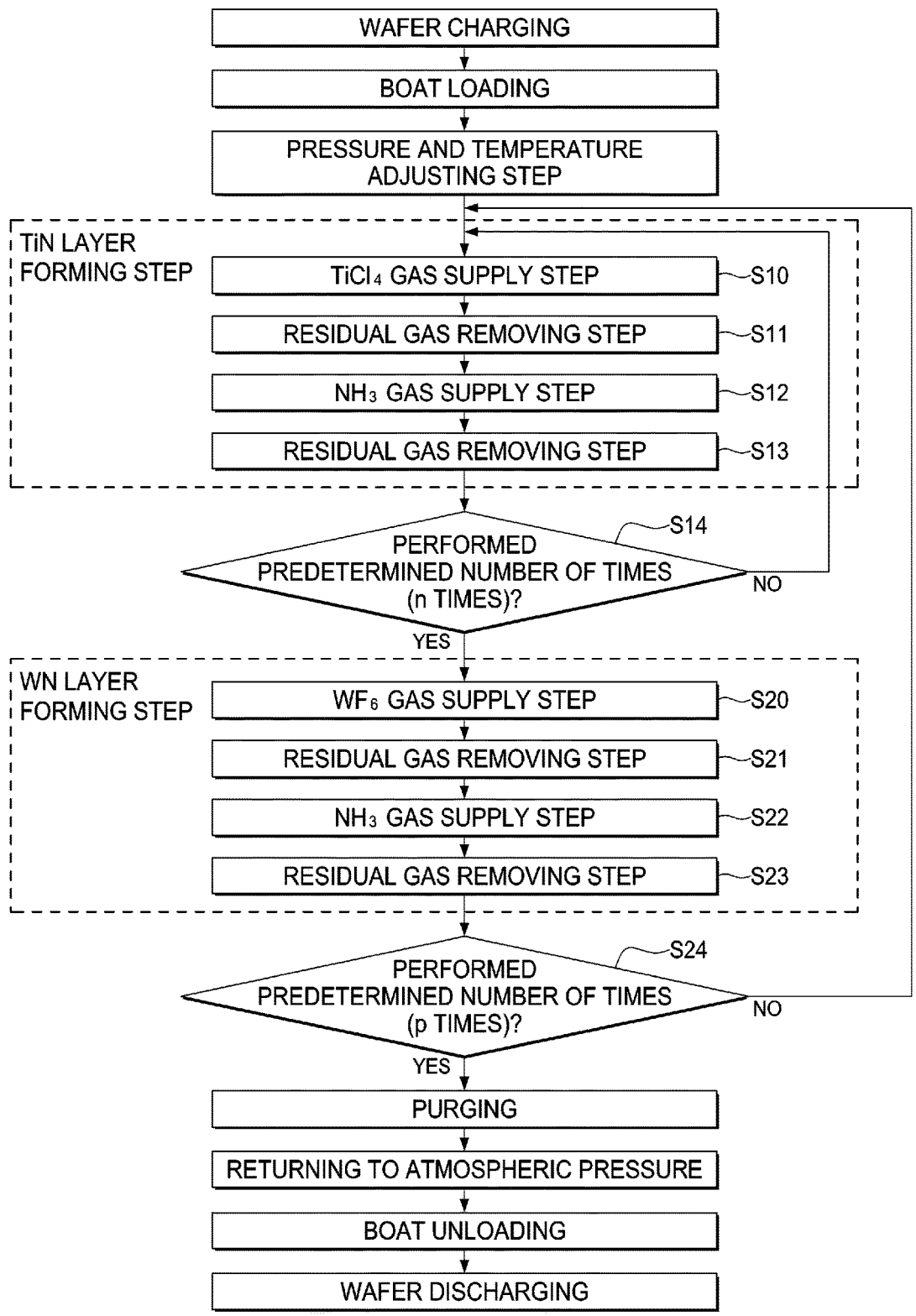
FIG. 4 is a flowchart illustrating a substrate processing according to the first embodiment.
Figure 5:
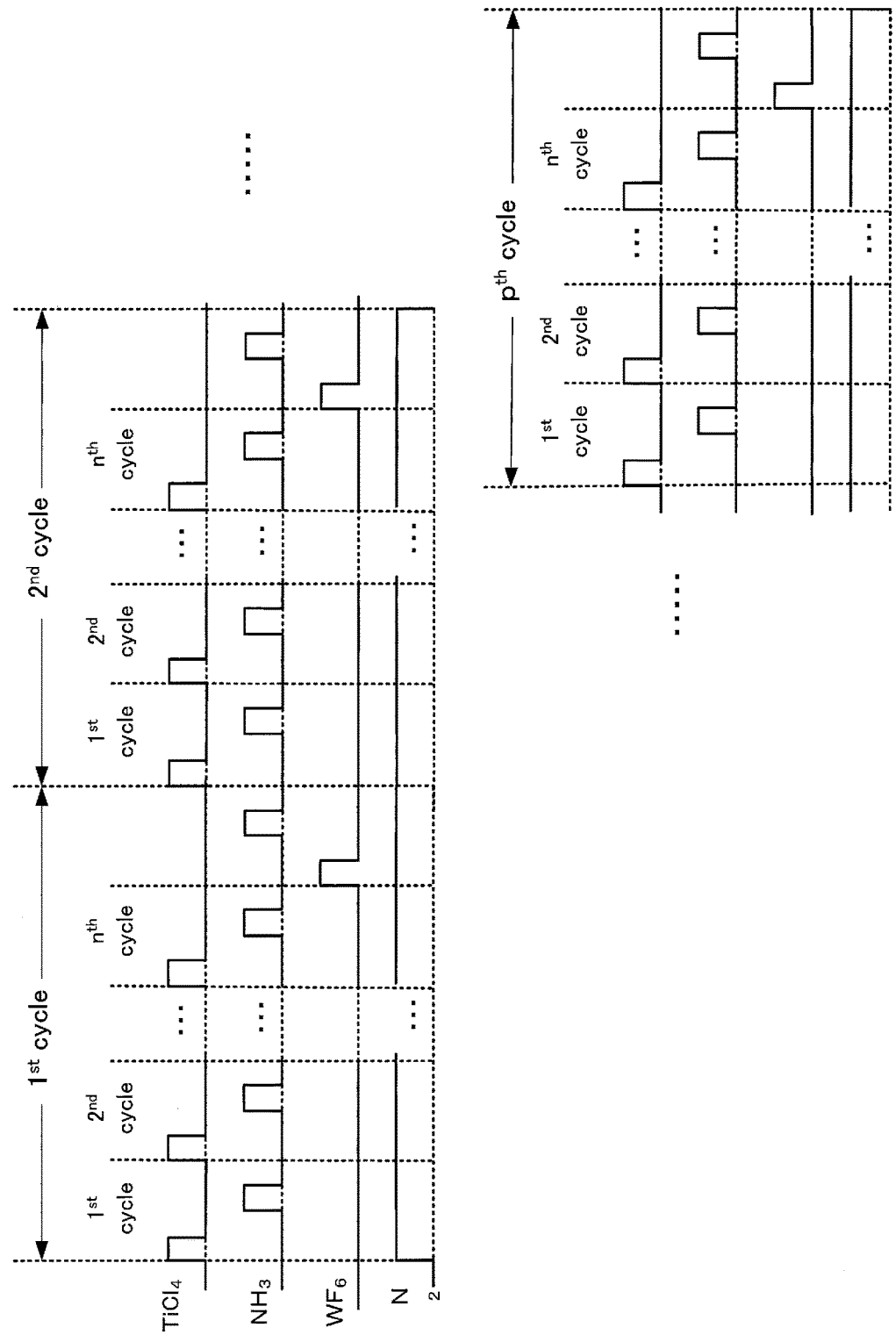
FIG. 5 is a timing diagram of a gas supply according to the first embodiment.
Figure 10:
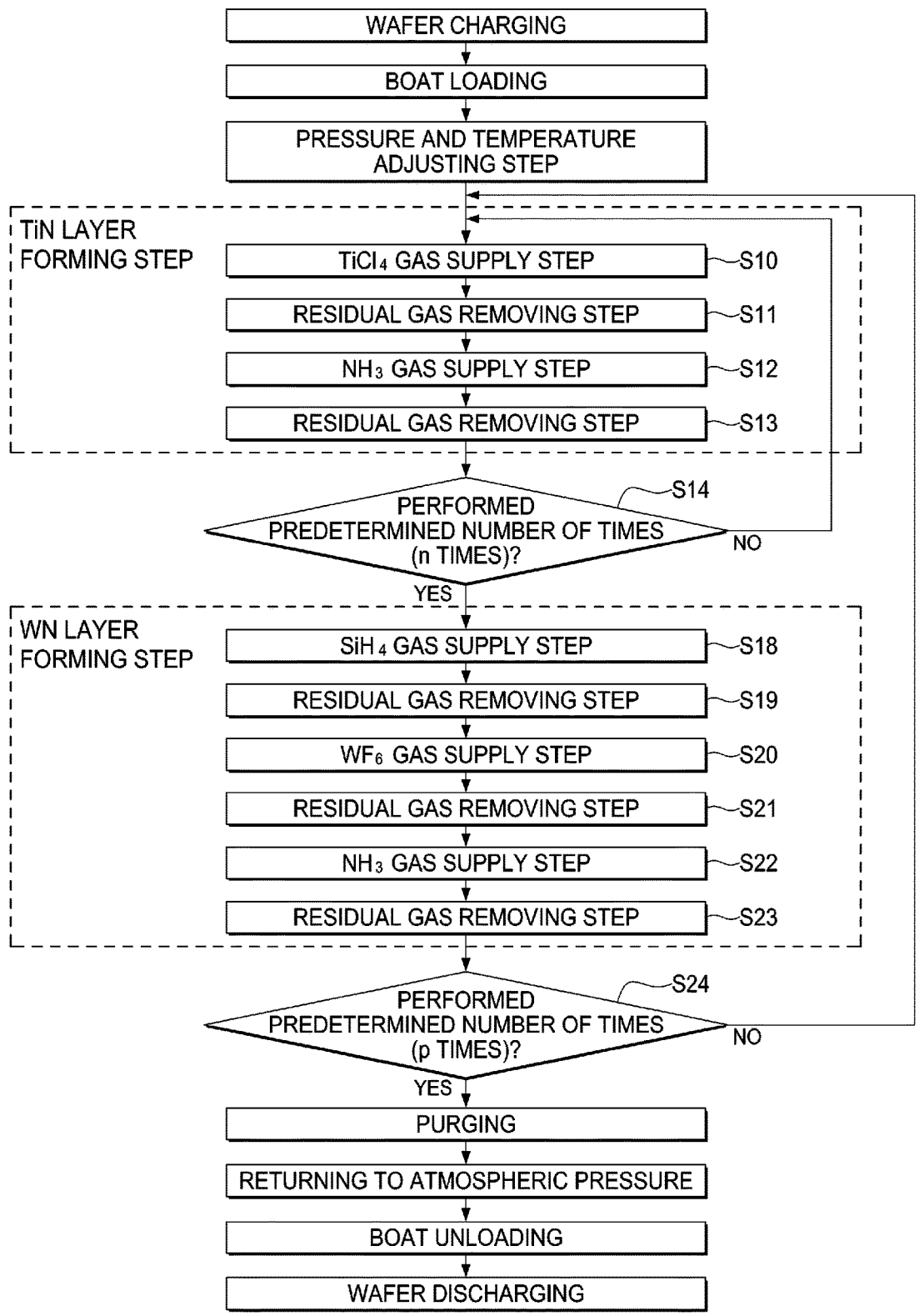
FIG. 10 is a flowchart illustrating a substrate processing according to a second embodiment.

According to a second embodiment, as shown in FIG. 10, a silane ($SiH_4$) gas, which is a reducing gas, is supplied before performing the $WF_6$ gas supply step S20 in the WN layer forming step of the first embodiment shown in FIGS. 4 and 5. Specifically, according to the second embodiment, first, the first cycle including the $TiCl_4$ gas supply step S10 through the residual gas removing step S13 performed in order, which is the TiN layer forming step according to the first embodiment, is performed one or more times (n times). Contrary to the first embodiment, according to the second embodiment, a silane (SiH$_4$) gas supply step S18, a residual gas removing step S19 and the second cycle including the WF$_6$ gas supply step S20 through the residual gas removing step S23 are then performed once in order. That is, according to the second embodiment, the WN layer forming step further includes the silane gas supply step S18 and the residual gas removing step S19. Thereafter, a cycle including the first cycle and the WN layer forming step performed in order is performed one or more times (p times) (S24) to form a conductive TiWN film having a predetermined thickness (for example, 0.1 to 10 nm) on the wafer 200.

According to the second embodiment, since Si is converted into Si$_x$F$_y$ and then removed, silicon (Si) does not remain in the film. Gases such as diborane (B$_2$H$_6$) gas and disilane (Si$_2$H$_6$) gas may be used as a reducing gas as well as silane (SiH$_4$) gas. However, since the WN layer forming step according to the second embodiment is performed at a wafer temperature of 300° C., it is preferable to use SiH$_4$ as a reducing gas. When a reducing gas is used, the resistance of the film may be reduced compared to when the reducing gas is not used.

Other Embodiments

The above-described technique may also be applied when a sheet-type substrate processing apparatus is used. According to on embodiment, a cycle including: simultaneously supplying TiCl$_4$ gas and WF$_6$ gas; removing residual gas; supplying NH$_3$ gas and removing residual gas is performed one or more times (n times). Depending on the adsorption rate of each gas, the ratio of TiCl$_4$ to WF$_6$ is adjusted to be greater than 1 when the TiCl$_4$ gas and the WF$_6$ gas are simultaneously supplied. Considering the etching of the TiN bond formed on the wafer by the by-product HF, the resulting ratio of Ti to W is about 1:1 by supplying TiCl$_4$ more than WF$_6$.

While the first embodiment is described by way of an example wherein a metal film containing a metal element having a high work function and a low binding energy with oxygen (likely to release oxygen) and a metal film containing a metal element having a high bonding energy with oxygen (unlikely to release oxygen) are combined, the above-described technique is not limited thereto. The above-described technique may be applied the formation of a metal carbide film as well as the formation of a metal nitride film.

An experimental example will be described below. However, the above-described technique is not limited to the experimental example.

EXPERIMENTAL EXAMPLE

Figure 11:
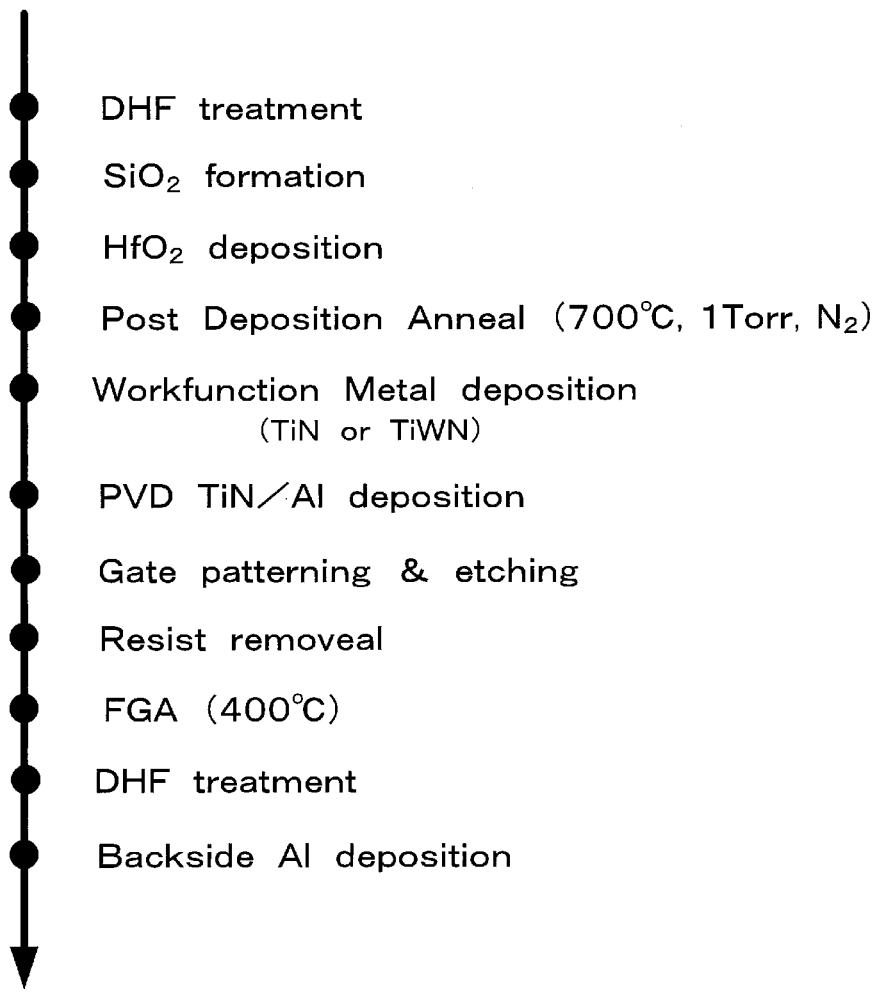
FIG. 11 is a flowchart illustrating a manufacturing process of MOSFET capacitor according to the first embodiment.

As shown in FIG. 11, a MOSFET capacitor was manufactured using the film-forming sequence according to the above-described embodiment. First, the wafer 200, which is a silicon semiconductor substrate, was subjected to a DHF treatment, and then a silicon oxide film (SiO$_2$ film) was formed. A hafnium oxide film (HfO$_2$ film, hereinafter also referred to as HfO film), which is a high-k film, was then formed as a gate insulating film. Thereafter, annealing process was performed at 700° C., 1 Torr under N$_2$ atmosphere, and a TiN film and a TiWN film, which are metal films, were formed on the HfO$_2$ film using the processing furnace 202 of the substrate processing apparatus 10. A TiN film and an Al film were formed by performing a PVD (Physical Vapor Deposition) process, followed by gate patterning, gate etching, photoresist removal, heat treatment (400° C.) and DHF treatment to form backside aluminum.

In the experimental example, HfO$_2$ films having different thicknesses ranging from 4 nm to 10 nm were prepared. A MOSFET capacitor including a TiWN film as the metal film having a high concentration of WN with WN bond next to another WN bond (first comparative example), a MOSFET capacitor including a TiN film as the metal film (second comparative example), and a MOSFET capacitor including a TiWN film as the metal film according to the first embodiment were also used. The TiWN film according to the first embodiment was formed by the film-forming sequence shown FIG. 4 and the gas supply timing shown in FIG. 5. The process conditions at each step were set within the ranges of those of the above-described first embodiment. The treatment conditions are as follows.

<TiN Layer Forming Step>
<TiN Layer Forming Step>
<TiCl$_4$ Gas Supply Step S10>

The inner temperature of the process chamber: 370° C. to 390° C.
The inner pressure of the process chamber: 50 Pa to 70 Pa
The flow rate of TiCl$_4$ gas: 200 sccm to 400 sccm
The time duration of TiCl$_4$ gas supply: 3 seconds to 7 seconds <NH$_3$ Gas Supply Step S12>

The inner temperature of the process chamber: 370° C. to 390° C.
The inner pressure of the process chamber: 50 Pa to 70 Pa
The flow rate of NH$_3$ gas: 7000 sccm to 8000 sccm
The time duration of NH$_3$ gas supply: 3 seconds to 7 seconds <WN Layer Forming Step>
<WF$_6$ Gas Supply Step S20>

The inner temperature of the process chamber: 370° C. to 390° C.
The inner pressure of the process chamber: 50 Pa to 70 Pa
The flow rate of WF$_6$ gas: 400 sccm to 600 sccm
The time duration of WF$_6$ gas supply: 3 seconds to 7 seconds <NH$_3$ Gas Supply Step S22>

Figure 12A:
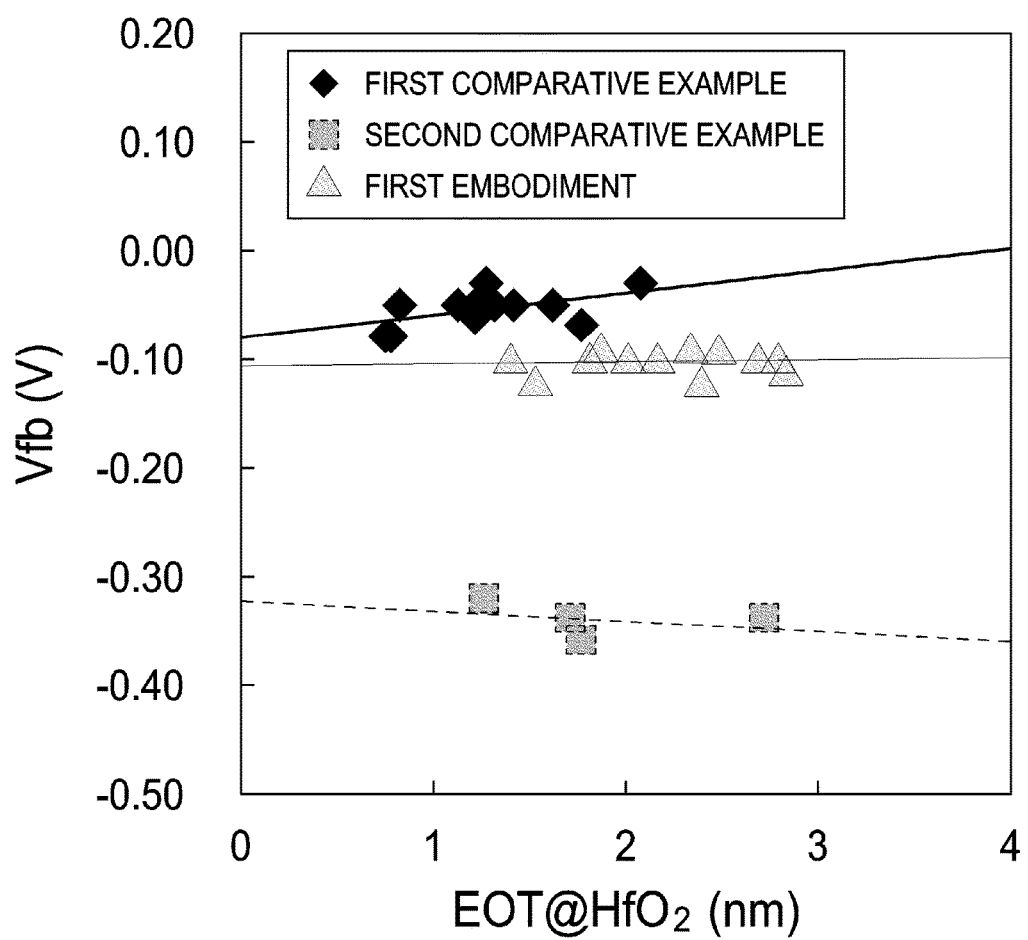
FIG. 12A is a diagram illustrating an EOT-Vfb relationship obtained from the CV and IV characteristics of the MOSFET capacitor of FIG. 11.
Figure 12B:
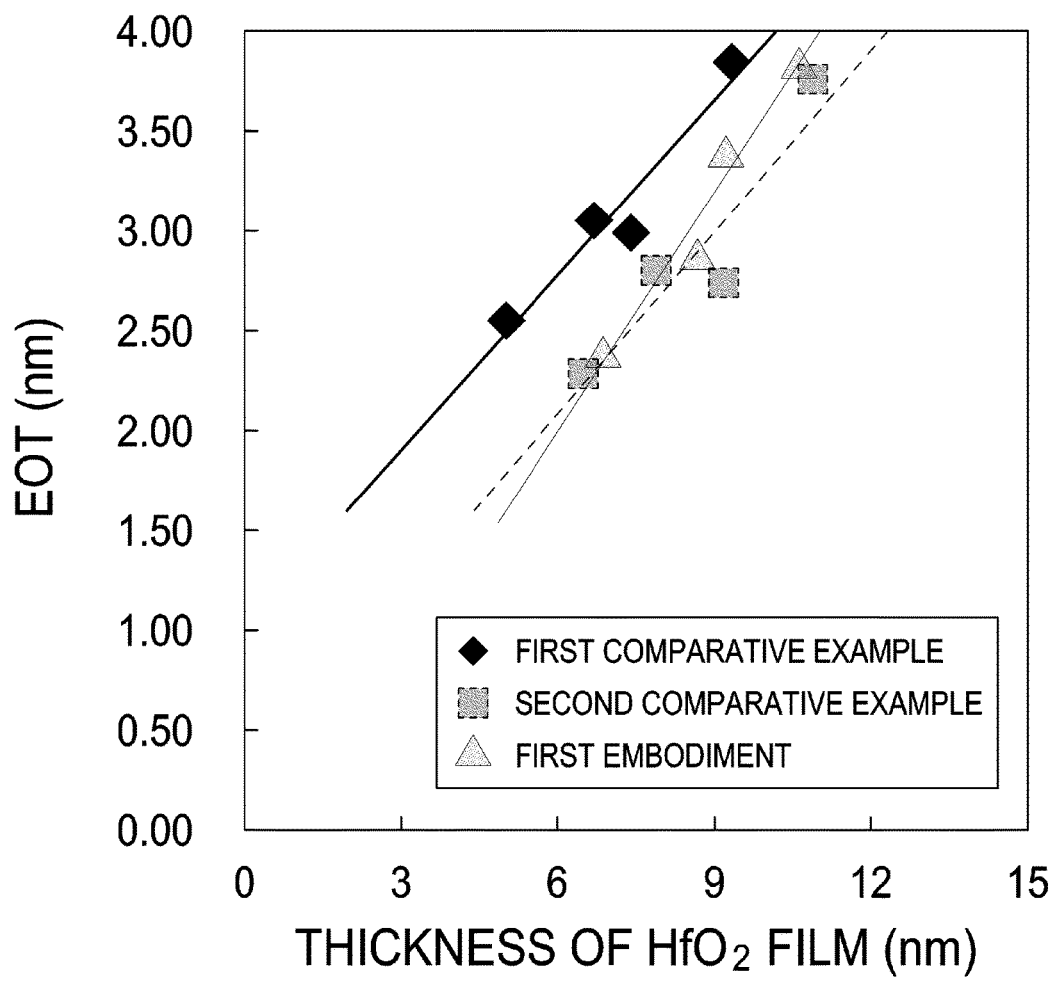
FIG. 12B is a diagram illustrating the thickness of $HfO_2$ film-EOT relationship.

The inner temperature of the process chamber: 370° C. to 390° C.
The inner pressure of the process chamber: 50 Pa to 70 Pa
The flow rate of NH$_3$ gas: 7000 sccm to 8000 sccm
The time duration of NH$_3$ gas supply: 15 seconds to 25 seconds FIG. 12A illustrates an EOT-Vfb relationships between the EOT and the flat band voltage (Vfb) of the HfO$_2$ film obtained from the capacitance-voltage characteristics (C-V characteristics) and the current-voltage characteristics (I-V characteristics) of the capacitors of the MOSFETs of the first comparative example, the second comparative example and the first embodiment. FIG. 12B illustrates a thickness-EOT relationship between the thickness of the HfO$_2$ film and EOT. FIG. 12C illustrates effective work function obtained from FIG. 12A.

As shown in FIG. 12C, the effective work functions of the TiWN films of the first comparative example and the first embodiment are about 0.2 eV higher than that of the TiN film of the second comparative example. According to the relationship between the thickness of the HfO$_2$ film and the EOT shown in FIG. 12B, the TiN film of the second comparative example and the TiWN film of the first embodiment have almost the same Y-intercept value. However, the Y-intercept value of the TiWN film of the first comparative example is larger than the Y-intercept value of the second comparative example and the first embodiment. It is preferable that the Y-intercept value is small because the Y-intercept value represents an EOT component other than the HfO$_2$ film such as the SiO$_2$ film formed at the interface between HfO$_2$ and the silicon substrate. From the above results, it may be said that the TiWN film having a high WN concentration as in the first comparative example increases the SiO$_2$ in the process of manufacturing the MOSFET capacitor. That is, according to the first embodiment, since the metal film unlikely to release oxygen is formed at the interface between HfO$_2$ and the silicon substrate, a metal film having a high work function may be provided while suppressing the increase in EOT.

While the experimental example is described by way of an example wherein HfO$_2$ film is used as the capacitor insulating film, the above-described technique is not limited thereto. The above-described technique may also be applied to high-k insulating films such as titanium oxide (TiO$_2$) film, zirconium oxide (ZrO$_2$) film, niobium oxide (Nb$_2$O$_5$) film, tantalum oxide (Ta$_2$O$_5$) film, strontium titanate (SrTiO), lead zirconate titanate (PZT) film, aluminum oxide (Al$_2$O$_3$) film, yttrium oxide (Y$_2$O$_3$) film, lanthanum oxide (La$_2$O$_3$) film and any combinations thereof.

While the experimental example is described by way of an example wherein a WN layer is used as an electrode, the above-described technique is not limited thereto. The above-described technique may also be applied to a film containing elements such as molybdenum (Mo), nickel (Ni) and cobalt (Co), and a nitride film and a carbonized film of these elements, and any combinations thereof.

While the experimental example is described by way of an example wherein a MOSFET capacitor is used, the above-described technique is not limited thereto. The above-described technique may also be applied to a capacitor electrode of a DRAM and a control gate of a flash memory.

The foregoing description has been made on the basis of various embodiments and modifications. However, the above-described techniques are not limited to the above-described embodiments and modifications, and may be appropriately combined.

According to the technique described herein, a metal film having a high work function may be formed while suppressing an increase in EOT.

What is claimed is:

1. A method of manufacturing a semiconductor device, comprising:
    (a) performing a first cycle a first number of times to form a first metal layer containing a first metal element, the first cycle comprising: (a-1) supplying a first metal-containing gas containing the first metal element to a substrate accommodated in a process chamber; (a-2) removing the first metal-containing gas from the process chamber; (a-3) supplying a reactive gas to the substrate; and (a-4) removing the reactive gas from the process chamber; and
    (b) performing a second cycle to form a second metal layer containing a second metal element directly on the first metal layer, wherein a binding energy of second metal element with oxygen is higher than that of the first metal element with oxygen, the second cycle comprising: (b-1) supplying a second metal-containing gas containing the second metal element to the substrate having thereon the first metal layer and accommodated in the process chamber; (b-2) removing the second metal-containing gas from the process chamber; (b-3) supplying the reactive gas to the substrate; and (b-4) removing the reactive gas from the process chamber, wherein a cycle comprising (a) and (b) is performed a second number of times to form a conductive film containing the first metal element and the second metal element on the substrate, the conductive film having: a work function higher than that of the first metal layer; and a binding energy with oxygen higher than that of the first metal element with oxygen.

2. The method according to claim 1, wherein the first metal element contained in the conductive film is disposed within three bonds of the second metal element contained in the conductive film.

3. The method according to claim 1, wherein the first metal element comprises titanium and the second metal element comprises tungsten.

4. The method according to claim 1, wherein each of the first metal-containing gas and the second metal-containing gas comprises a halide, the reactive gas comprises a nitriding gas, and the conductive film comprises a metal nitride film.

5. The method according to claim 1, wherein the first number of times ranges from 10 to 80 times.

6. The method according to claim 5, wherein the first number of times ranges from 10 to 15 times.

7. The method according to claim 1, wherein the first number of times ranges such that a ratio of the first metal element contained in the conductive film to the second metal element contained in the conductive film is 1:1.

8. The method according to claim 1, wherein (b) further comprises: (b-5) supplying a reducing gas to the substrate having thereon the first metal layer and accommodated in the process chamber before performing (b-1); and (b-6) removing the reducing gas from the process chamber after performing (b-5).

9. The method according to claim 8, wherein the reducing gas comprises monosilane gas, diborane gas and disilane gas.

10. A method of manufacturing a semiconductor device, comprising:
    (a) performing a first cycle a first number of times to form a first metal layer containing a first metal element, the first cycle comprising: (a-1) supplying a first metal-containing gas containing the first metal element to a substrate accommodated in a process chamber; (a-2) removing the first metal-containing gas from the process chamber; (a-3) supplying a reactive gas to the substrate; and (a-4) removing the reactive gas from the process chamber; and
    (b) performing a second cycle a second number of times to form a second metal layer containing a second metal element directly on the first metal layer such that the first metal element contained in the first metal layer is disposed within three bonds of the second metal element contained in the second metal layer, wherein a binding energy of second metal element with oxygen is higher than that of the first metal element with oxygen, the second cycle comprising: (b-1) supplying a second metal-containing gas containing the second metal element to the substrate having thereon the first metal layer and accommodated in the process chamber; (b-2) removing the second metal-containing gas from the process chamber; (b-3) supplying the reactive gas to the substrate; and (b-4) removing the reactive gas from the process chamber, wherein a cycle comprising (a) and (b) is performed a third number of times to form a conductive film containing the first metal element and the second metal element on the substrate, the conductive film having: a work function higher than that of the first metal layer; and a binding energy with oxygen higher than that of the first metal element with oxygen.

* * * * *